US012564114B2

(12) United States Patent
Saegusa

(10) Patent No.: US 12,564,114 B2
(45) Date of Patent: Feb. 24, 2026

(54) SEMICONDUCTOR APPARATUS AND METHOD OF MANUFACTURING SEMICONDUCTOR APPARATUS

(71) Applicant: FUJI ELECTRIC CO., LTD., Kawasaki (JP)

(72) Inventor: Naoki Saegusa, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 651 days.

(21) Appl. No.: 17/681,390

(22) Filed: Feb. 25, 2022

(65) Prior Publication Data

US 2022/0344245 A1 Oct. 27, 2022

(30) Foreign Application Priority Data

Apr. 22, 2021 (JP) ................................. 2021-072467

(51) Int. Cl.
H01L 23/495 (2006.01)
H01L 21/56 (2006.01)
(Continued)

(52) U.S. Cl.
CPC ........ H10W 90/811 (2026.01); H10W 70/421 (2026.01); H10W 74/016 (2026.01);
(Continued)

(58) Field of Classification Search
CPC ........... H01L 23/49575; H01L 23/3107; H01L 23/49541; H01L 23/36; H01L 23/057; H01L 23/24; H01L 23/49548; H01L 23/49555; H01L 21/565; H01L 21/50; H01L 21/56; H01L 25/0655; H01L 25/16;

H01L 25/072; H01L 25/18; H01L 24/48; H01L 24/49; H01L 24/29; H01L 24/32; H01L 24/73; H01L 24/84; H01L 2224/48138; H01L 2224/48175; H01L 2224/4912; H01L 2224/29101; H01L 2224/29339; H01L 2224/32245;
(Continued)

(56) References Cited

U.S. PATENT DOCUMENTS

2002/0057553 A1* 5/2002 Jeon .................. H01L 23/49575
361/709
2014/0231975 A1 8/2014 Denta et al.
(Continued)

FOREIGN PATENT DOCUMENTS

JP 62296541 A 12/1987
JP 02106845 U 8/1990
(Continued)

OTHER PUBLICATIONS

Tezuka et al.; "2nd-Generation Small IPM Series"; Fuji Electric Review, vol. 89, No. 4, 2016, pp. 261-265 (vol. 62 No. 4, 2016, pp. 247-250 of English version.
(Continued)

*Primary Examiner* — Julio J Maldonado
*Assistant Examiner* — Nathan Pridemore

(57) ABSTRACT

A resin enclosure includes: an inner wall portion from a wall surface defining the space to a side surface of the lead terminal close to the space; and a covering portion that covers at least a part of a top surface of a first portion of the lead terminal.

15 Claims, 8 Drawing Sheets

(51) Int. Cl.

| | |
|---|---|
| *H01L 23/00* | (2006.01) |
| *H01L 23/31* | (2006.01) |
| *H01L 25/065* | (2023.01) |
| *H10W 70/40* | (2026.01) |
| *H10W 74/01* | (2026.01) |
| *H10W 74/10* | (2026.01) |
| *H10W 90/00* | (2026.01) |
| *H10W 72/00* | (2026.01) |

(52) U.S. Cl.
    CPC .......... *H10W 74/111* (2026.01); *H10W 90/00* (2026.01); *H10W 72/07554* (2026.01); *H10W 90/753* (2026.01); *H10W 90/755* (2026.01)

(58) Field of Classification Search
    CPC ..... H01L 2224/451; H01L 2224/48091; H01L 2224/48137; H01L 2224/48139; H01L 2224/48157; H01L 2224/48247; H01L 2224/48472; H01L 2224/4903; H01L 2224/49171; H01L 2224/73265; H01L 2224/83801; H01L 2224/85205; H01L 2224/85; H01L 2924/37001; H01L 2924/181; H01L 23/49558
    See application file for complete search history.

(56) References Cited

U.S. PATENT DOCUMENTS

| | | |
|---|---|---|
| 2014/0374889 A1 | 12/2014 | Denta et al. |
| 2017/0047280 A1 | 2/2017 | Tanaka et al. |
| 2020/0091025 A1* | 3/2020 | Ichimura ................. H01L 21/56 |

FOREIGN PATENT DOCUMENTS

| | | |
|---|---|---|
| JP | 06120271 A | 4/1994 |
| JP | 113003899 A | 1/1999 |
| JP | 2009267071 A | 11/2009 |
| JP | 2013239479 A | 11/2013 |
| JP | 2013258321 A | 12/2013 |
| JP | 2014-157925 A | 8/2014 |
| JP | 2017038019 A | 2/2017 |
| JP | 2021034384 A | 3/2021 |

OTHER PUBLICATIONS

Japanese Office Action issued in counterpart Japanese patent application No. 2021-072467 dated Nov. 26, 2024.

* cited by examiner

SEMICONDUCTOR APPARATUS AND METHOD OF MANUFACTURING SEMICONDUCTOR APPARATUS

CROSS REFERENCE TO RELATED APPLICATION

This application claims priority from Japanese Patent Application No. 2021-072467, filed Apr. 22, 2021, the entire contents of which are incorporated herein by reference.

BACKGROUND

Field of the Invention

The present invention relates to semiconductor apparatuses and to methods of manufacturing semiconductor apparatuses.

Description of Related Art

A semiconductor apparatus is known in which a semiconductor chip is enclosed in a resin enclosure, the semiconductor chip including a power semiconductor element, such as an insulated gate bipolar transistor (IGBT). In such a semiconductor apparatus, lead terminals for external connection are provided in the resin enclosure.

Patent Document 1 (Japanese Patent Application Laid-Open Publication No. 2017-38019) discloses a semiconductor apparatus in which an electronic component connected to a semiconductor chip is disposed on a predetermined lead terminal among the lead terminals.

SUMMARY

The semiconductor apparatus as described above is desired to reduce the rate of defective units in manufacturing processes.

A semiconductor apparatus according to one aspect of the present invention includes: a resin enclosure; a lead terminal that extends from an inside to an outside of the resin enclosure; and a first semiconductor chip that is disposed in a space positioned inside the resin enclosure, in which the resin enclosure includes: an inner wall portion from a wall surface defining the space to a side surface of the lead terminal close to the space; and a covering portion that covers at least a part of a top surface of a first portion of the lead terminal.

A method of manufacturing a semiconductor apparatus according to one aspect of the present invention is a method of manufacturing a semiconductor apparatus including: a resin enclosure; a lead terminal that extends from an inside to an outside of the resin enclosure; and a first semiconductor chip that is disposed in a space positioned inside the resin enclosure, the method includes: inserting the lead frame that includes the lead terminal into a mold for the resin enclosure; and forming, by injecting a resin into the mold and curing the resin, the resin enclosure that includes: an inner wall portion from a wall surface defining the space to a side surface of the lead terminal close to the space; and a covering portion covering at least a part of a top surface of a first portion of the lead terminal.

The semiconductor apparatus and the method of manufacturing the semiconductor apparatus according to the present invention yields fewer defective units in manufacturing processes.

DESCRIPTION OF THE EMBODIMENTS

Figure 1:
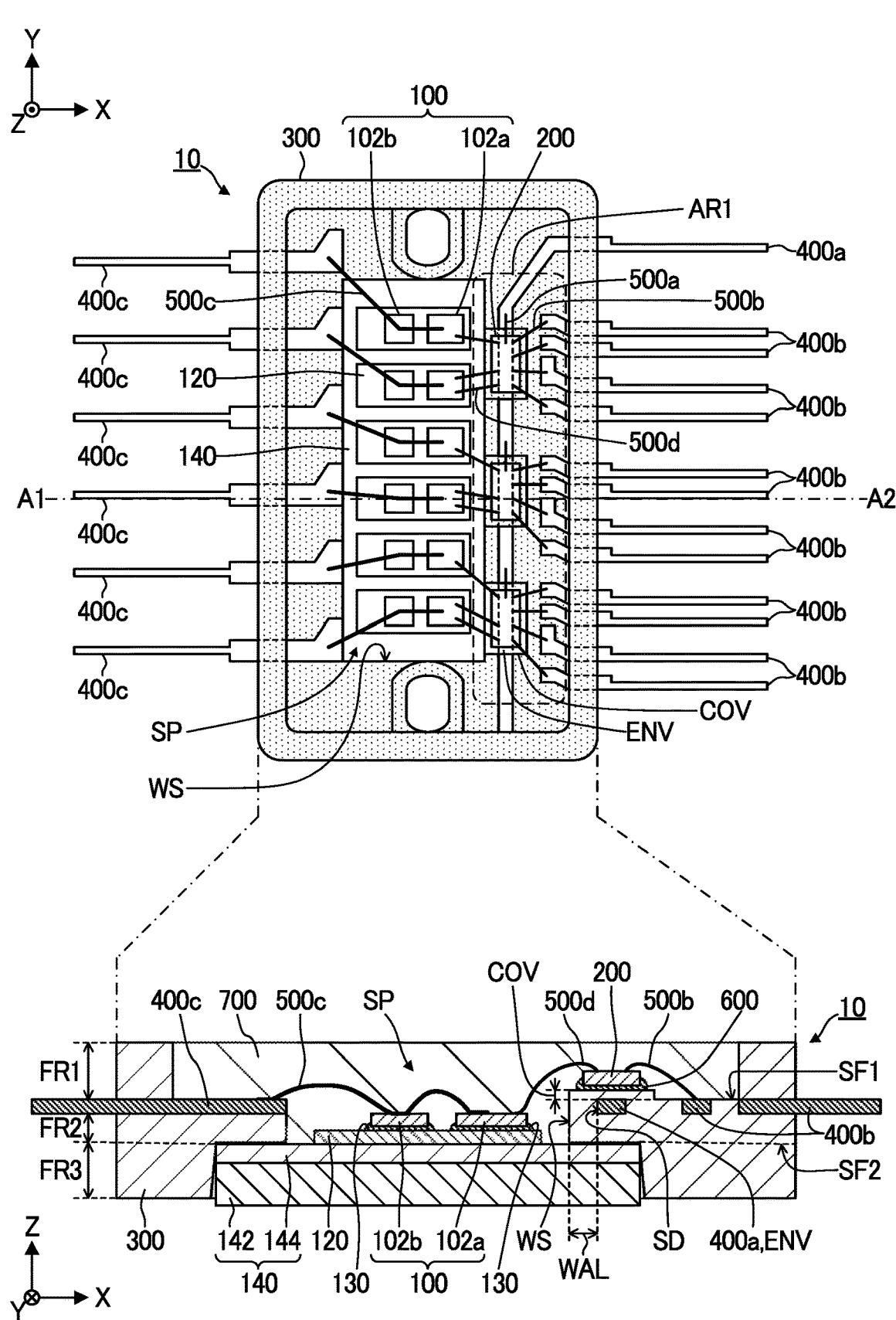
FIG. 1 is a schematic diagram of a semiconductor apparatus according to a first embodiment.

Some embodiments of the present invention will be described below with reference to the drawings.

In the drawings, the dimensions and scales of each element are appropriately different from actual ones.

The Embodiment described below includes preferable specific examples of the present disclosure. Accordingly, various technically preferable limitations are applied. However, the scope of the present disclosure is not limited to these modes, unless there is a specific description limiting the present disclosure.

A. Embodiment

Some embodiments of the present invention are described below. First, an example of an overview of a semiconductor apparatus 10 according to a first embodiment will be described with reference to FIG. 1.

A1: First Embodiment

FIG. 1 is a schematic diagram of the semiconductor apparatus 10 according to the first embodiment.

In the following, a three-axis orthogonal coordinate system, which includes an X axis, a Y axis, and a Z axis that are orthogonal to one another, is adopted for convenience of description. In the following, a direction indicated by an arrow of the X axis is referred to as a +X direction, and a direction opposite to the +X direction is referred to as a −X direction. A direction indicated by an arrow of the Y axis is referred to as a +Y direction, and a direction opposite to the +Y direction is referred to as a −Y direction. A direction indicated by an arrow of the Z axis is referred to as a +Z direction, and a direction opposite to the +Z direction is referred to as a −Z direction. In the following description, the +Y direction and the −Y direction are each referred to as the Y direction without particular discrimination in some cases, and the +X direction and the −X direction are each referred to as the X direction without particular discrimination in some cases. Furthermore, the +Z direction and the −Z direction are each referred to as the Z direction without particular discrimination in some cases. In the following, the +Z direction is referred to as an up direction or an upper side, and the −Z direction is referred to as a down direction or a lower side in some cases. In the present embodiment, the Y direction is an example of "first direction", and the X direction is an example of "second direction orthogonal to first direction". The term "orthogonal" includes not only strictly orthogonal, but also substantially orthogonal (for example, orthogonal within an error range).

Furthermore, in the following, viewing of an object from a specific direction is referred to as a planar view in some cases.

FIG. 1 shows (i) a plan view of the semiconductor apparatus 10 in a planar view from the +Z direction, and (ii) a cross-sectional view of the semiconductor apparatus 10 taken along line A1-A2 in a planar view. In the following, the planar view from the +Z direction is simply referred to as "planar view" in some cases. The planar view from the +Z direction corresponds to planar view from a direction perpendicular to a top surface TP1 (see FIG. 2) of a lead terminal 400a.

The semiconductor apparatus 10 is a power semiconductor apparatus that includes a power semiconductor element. Examples of a power semiconductor element include a power metal oxide semiconductor field effect transistor (MOSFET), and an insulated gate bipolar transistor (IGBT). Examples of the power semiconductor apparatus include an inverter apparatus including a switching element such as a power MOSFET and an IGBT and a control circuit controlling the switching element. In the present embodiment, the semiconductor apparatus 10 may be an intelligent power module (IPM) in which the switching element, the control circuit, and the like are enclosed in one package.

For example, the semiconductor apparatus 10 includes chip pairs 100, control chips 200, a resin enclosure 300, and lead terminals 400 (400a, 400b, and 400c). The semiconductor apparatus 10 further includes circuit layers 120, connection portions 130, an insulation metal substrate 140, wires 500 (500a, 500b, 500c, and 500d), and a sealing resin 700. Each of the chip pairs 100 is a set of a power semiconductor chip 102a and a power semiconductor chip 102b. In the following, the power semiconductor chips 102a and 102b are collectively referred to as power semiconductor chips 102 in some cases. In the plan view of FIG. 1, the resin enclosure 300 is illustrated by hatching.

Each of the power semiconductor chips 102a is an example of a "first semiconductor chip". For example, each of the power semiconductor chips 102a includes a semiconductor chip including a switching element such as a power MOSFET and an IGBT. For example, each of the power semiconductor chips 102b is a semiconductor chip including a diode such as a freewheeling diode (flyback diode), FWD, that is connected antiparallel with the switching element provided in the corresponding power semiconductor chip 102a. The diode connected in antiparallel with the switching element means that the diode is connected in parallel with the switching element such that a forward direction of the diode is opposite to a forward direction of the switching element. A set of the switching element and the diode may be formed in one semiconductor chip as a so-called reverse conducting IGBT (RC-IGBT).

In the example illustrated in FIG. 1, the chip pairs 100 are arranged with intervals in the Y direction, and are connected to the respective lead terminals 400c through the wires 500c. The power semiconductor chips 102a and 102b included in each of the chip pairs 100 are arranged, for example, with an interval in the X direction on each of the circuit layers 120. The circuit layers 120 are layers each provided with a wiring pattern and the like. Furthermore, for example, as illustrated in the cross-sectional view of FIG. 1, the chip pairs 100 are connected to the respective circuit layers 120 by the connection portions 130. Each of the connection portions 130 may be a conductive brazing material containing a metal material such as silver, or a soldering material. The circuit layers 120 are disposed on the insulation metal substrate 140 (more specifically, on insulation layer 144 described below). The insulation metal substrate 140 includes a metal substrate 142 made of a metal material, and the insulation layer 144 made of an insulation material on the metal substrate 142. For example, the insulation layer 144 is a ceramic substrate, and the metal substrate 142 acts as a heat dissipation plate that dissipates heat generated from the chip pairs 100.

Each of the control chips 200 is an example of a "second semiconductor chip". The control chips 200 control the power semiconductor chips 102a and 102b. For example, each of the control chips 200 includes an integrated circuit that controls conduction and non-conduction of the power semiconductor chips 102a and 102b. In the present embodiment, each of the control chips 200 may be a high voltage integrated circuit (HVIC). For example, a case will be assumed in which a circuit having two switching elements which are connected in series between two wires, the HVIC is an integrated circuit driving a gate of the switching element connected to the wire having a higher voltage out of the two wires. An integrated circuit driving a gate of the switching element connected to the wire having a lower voltage out of the two wires is also referred to as a low voltage integrated circuit (LVIC).

The lead terminals 400 are each made of, for example, a metal material. For example, the lead terminals 400 are formed integrally with the resin enclosure 300 by insert molding. As a result, the lead terminals 400 are arranged in the resin enclosure 300. For example, each of the lead terminals 400 includes, in a planar view, an end positioned on the resin enclosure 300 and an end positioned outside the resin enclosure 300. In other words, each of the lead terminals 400 extends from the inside to the outside of the resin enclosure 300.

Each of the lead terminals 400b extends, for example, in the X direction. The lead terminals 400b are arranged in the Y direction at an edge of the resin enclosure 300 in the +X direction. Each of the lead terminals 400c extends, for example, in the X direction. Furthermore, the lead terminals 400c are arranged in the Y direction at an edge of the resin enclosure 300 in the –X direction. For example, the chip pairs 100 are arranged between the lead terminals 400b and the lead terminals 400c. The lead terminal 400a is provided so as to pass through the edge of the resin enclosure 300 in the +X direction from an area between the chip pairs 100 and the lead terminals 400b. In other words, the lead terminal 400a includes a portion extending in an arrangement direction (Y direction) of the chip pairs 100 on the resin enclosure 300. The portion of the lead terminal 400a extending in the Y direction includes "first portion". In the present embodiment, the "first portion" of the lead terminal 400a is an area (portion) of the lead terminal 400a at which a top surface and side surfaces are fixed by the resin enclosure 300. More specifically, in the present embodiment, the "first portion" may be an enclosed portion ENV enclosed by the resin enclosure 300.

The control chips 200 are arranged with intervals in the Y direction on the portion of the lead terminal 400a extending in the Y direction. For example, the control chips 200 may be disposed on the resin enclosure 300 so as to overlap with the lead terminal 400a (enclosed portions ENV of lead terminal 400a in the example illustrated in FIG. 1) in a planar view. Furthermore, the control chips 200 are connected to the lead terminal 400a by the wires 500a, are connected to the lead terminals 400*b* by the wires 500*b*, and are connected to the power semiconductor chips 102*a* by the wires 500*d*. As a result, the control chips 200 are electrically connected to the lead terminal 400*a* and the like. For example, a voltage such as a ground voltage common to the control chips 200 is supplied to the lead terminal 400*a*. The wires 500 are each made of metal material.

As described above, in the present embodiment, since the control chips 200 are arranged on the lead terminal 400*a*, the semiconductor apparatus 10 is reduced in size, as compared with a case in which the control chips 200 are arranged on the resin enclosure 300 so as not to overlap the lead terminal 400*a* in planar view. In the present embodiment, since the control chips 200 are arranged on the lead terminal 400*a*, it is possible to prevent distances between the control chips 200 and the lead terminals 400*a* and 400*b* and distances between the control chips 200 and the power semiconductor chips 102*a* from being increased. As a result, in the present exemplary embodiment, it is possible to prevent the wires 500*a*, 500*b*, 500*d*, and the like connected to the control chips 200 from being of increased length.

The resin enclosure 300 is an example of "resin enclosure". For example, the resin enclosure 300 is a case in which the chip pairs 100 are arranged in a space SP inside thereof. The resin enclosure 300 is made of, for example, thermoplastic resin. Examples of the thermoplastic resin include polyphenylene sulfide (PPS) resin, polybutylene terephthalate (PBT) resin, polybutylene succinate (PBS) resin, polyamide (PA) resin, and acrylonitrile-butadiene-styrene (ABS) resin.

For example, as illustrated in the cross-sectional view of FIG. 1, the resin enclosure 300 includes an inner wall portion WAL and covering portions COV. The inner wall portion WAL and the covering portions COV of the resin enclosure 300 are described below with reference to FIG. 2.

For example, the resin enclosure 300 is understood to have a rectangular frame shape surrounding the chip pairs 100 in planar view. For example, as illustrated in the cross-sectional view of FIG. 1, the resin enclosure 300 includes a first frame portion FR1, a second frame portion FR2, and a third frame portion FR3. The second frame portion FR2 is a rectangular frame portion including an opening. The first frame portion FR1 is a rectangular frame portion protruding in the +Z direction from a peripheral edge on a first surface SF1 of the second frame portion FR2. The third frame portion FR3 is a rectangular frame portion protruding in the −Z direction from a peripheral edge on a second surface SF2 of the second frame portion FR2.

The lead terminals 400*b* and 400*c* are arranged between the first frame portion FR1 and the second frame portion FR2. The chip pairs 100 are positioned in the space SP inside the opening of the second frame portion FR2. An inner wall surface of the second frame portion FR2 corresponds to a wall surface WS defining the space SP. The control chips 200 are arranged on the first surface SF1 (more specifically, on portion surrounded by first frame portion FR1) of the second frame portion FR2. The second frame portion FR2 includes the covering portions COV at positions between the control chips 200 and the lead terminal 400*a*. The insulation metal substrate 140 is connected to the second surface SF2 (more specifically, a portion surrounded by third frame portion FR3) of the second frame portion FR2 by a connection portion (not shown). As a result, the insulation metal substrate 140 is disposed in a space inside an opening of the third frame portion FR3. As described above, the resin enclosure 300 is joined to the insulation metal substrate 140 such that the chip pairs 100 (power semiconductor chips

102*a* and 102*b*) are positioned in the space SP. In the following, the connection portion connecting the insulation metal substrate 140 to the resin enclosure 300 (more specifically, second surface SF2 of second frame portion FR2) is also referred to as a substrate joining portion.

When the insulation metal substrate 140 is joined to the resin enclosure 300, for example, an opening on a lower side of the resin enclosure 300 is closed, and a material of the sealing resin 700 is injectable into the space inside the resin enclosure 300 from an opening on the upper side. The material of the sealing resin 700 is a thermosetting resin such as an epoxy resin. The space inside the resin enclosure 300 is a space surrounded by, for example, the first frame portion FR1 and the second frame portion FR2. When the space inside the resin enclosure 300 is filled with the sealing resin 700 from the opening on the upper side of the resin enclosure 300, the circuit layers 120, the chip pairs 100 (power semiconductor chips 102*a* and 102*b*), the control chips 200, the wires 500, and the like are sealed by the sealing resin 700. The shape of the resin enclosure 300 is not limited to the above-described example. For example, the third frame portion FR3 may not be formed in a frame shape and may have a bottom surface shape closing the opening of the second frame portion FR2.

Next, the inner wall portion WAL and the covering portions COV of the resin enclosure 300 will be described with reference to FIG. 2.

Figure 2:
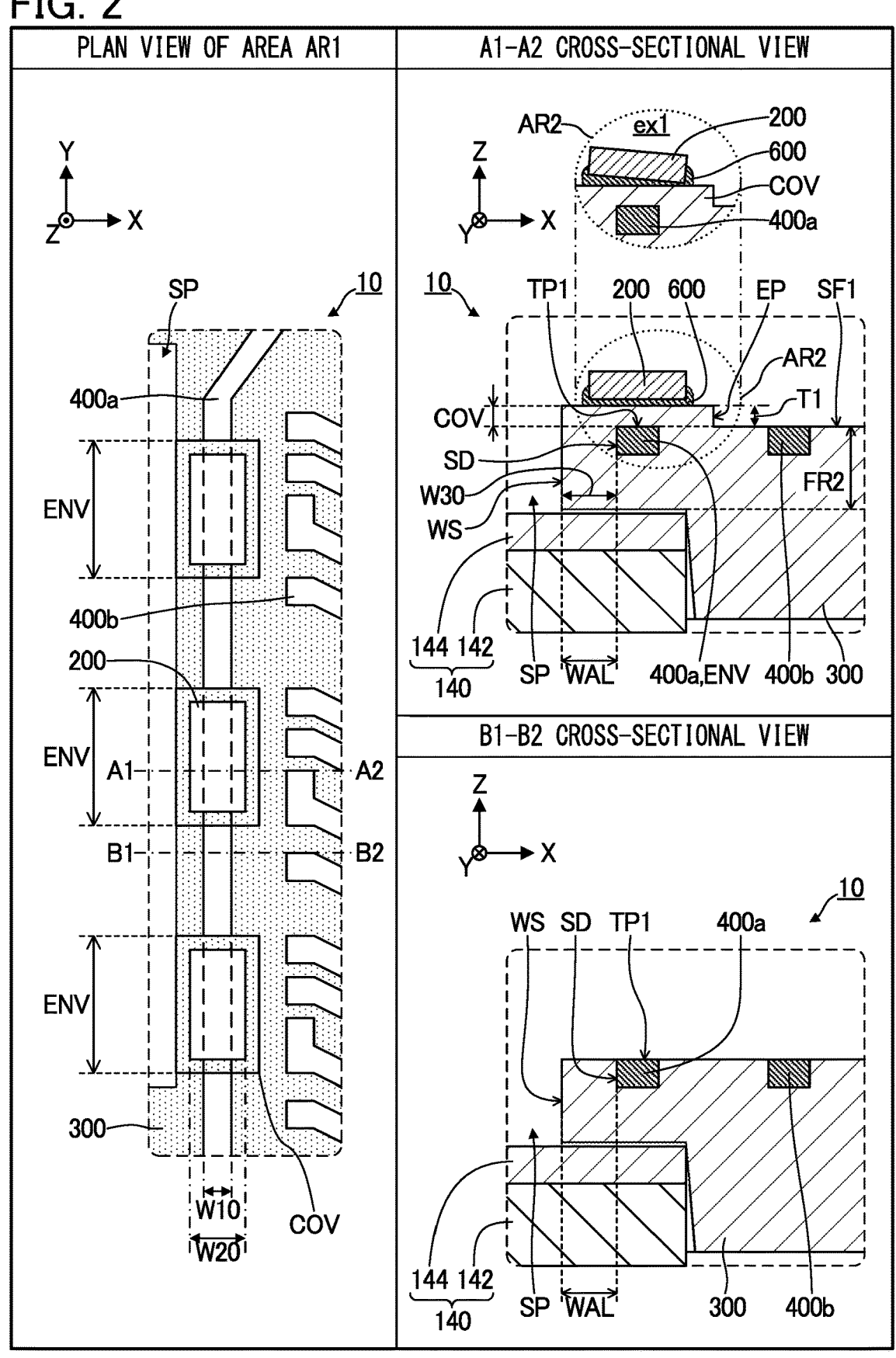
FIG. 2 is an explanatory diagram of an inner wall portion and covering portions illustrated in FIG. 1.

FIG. 2 is an explanatory diagram of the inner wall portion WAL and the covering portions COV illustrated in FIG. 1. A plan view of FIG. 2 shows an area AR1 enclosed by a dashed line shown in the plan view of FIG. 1. An A1-A2 cross-sectional view illustrates a cross-sectional surface of the semiconductor apparatus 10 taken along line A1-A2 in the plan view of the area AR1, and a B1-B2 cross-sectional view illustrates a cross-sectional surface of the semiconductor apparatus 10 taken along line B1-B2 in the plan view of the area AR1. As an explanatory diagram of an example in a case in which a certain control chip 200 is inclined, a cross-sectional view of the area AR2 including a cross-section of the lead terminal 400*a* and the control chip 200 inclined to an X-Y plane is also shown in the A1-A2 cross-sectional view. In FIG. 2, illustration of wires 500 and the like is omitted for clarity of illustration.

In the present embodiment, portions of the lead terminal 400*a* overlapping with the respective control chips 200 in a planar view are positioned inside the enclosed portions ENV in the Y direction as illustrated in the plan view of the area AR1. In other words, the enclosed portions ENV of the lead terminal 400*a* include the entirety of the portions of the lead terminal 400*a* overlapping with the respective control chips 200 in planar view. The covering portions COV are provided with intervals along the Y direction in which the lead terminal 400*a* extends. Each of the covering portions COV covers at least a part of a top surface of the corresponding enclosed portion ENV of the lead terminal 400*a* as illustrated in the A1-A2 cross-sectional view. More specifically, each of the covering portions COV is positioned between each of the enclosed portions ENV of the lead terminal 400*a* and the corresponding control chip 200.

As illustrated in the A1-A2 cross-sectional view, the lead terminal 400*a* includes the top surface TP1 facing the control chips 200, two side surfaces, and a bottom surface on a side opposite to the top surface TP1. For example, the top surface TP1, the two side surfaces, and the bottom surface of the lead terminal 400*a* are covered with the resin enclosure 300 in a specific cross-section (for example, cross-sectional surface of semiconductor apparatus 10 along line A1-A2) of the semiconductor apparatus 10. In other words, the lead terminal 400*a* is enclosed by the resin enclosure 300 in the specific cross-section. Portions of the lead terminal 400*a* enclosed by the resin enclosure 300 correspond to the enclosed portions ENV. A portion of the resin enclosure 300 enclosing the enclosed portions ENV of the lead terminal 400*a* includes the inner wall portion WAL and the covering portions COV. For example, the inner wall portion WAL is a portion from the wall surface WS defining the space SP to a side surface SD of the lead terminal 400*a* close to the space SP, of the second frame portion FR2 of the resin enclosure 300. The covering portions COV are portions covering the top surface TP1 of the lead terminal 400*a*, of the second frame portion FR2 of the resin enclosure 300.

For example, a lead frame including the lead terminals 400 has a plane shape. Therefore, the lead terminal 400*a* and the lead terminals 400*b* are positioned on the same plane. Thus, in the second frame portion FR2 of the resin enclosure 300, a step is formed between the surface of each of the covering portions COV and a surface of a portion other than the covering portions COV. In the portion other than the covering portions COV of the second frame portion FR2, for example, the lead terminals 400 and a first surface SF1 of the second frame portion FR2 are continuous with no step. Furthermore, out of the two side surfaces of each of the covering portions COV along the Y direction, a side surface EP far from the space SP is positioned between an area where the lead terminal 400*a* is disposed and an area where the lead terminals 400*b* are disposed. Out of the two side surfaces of each of the covering portions COV along the Y direction, a side surface close to the space SP configures a part of the wall surface WS. In other words, a range of the covering portions COV in the X direction is a range from a position between the area where the lead terminal 400*a* is disposed and the area where the lead terminals 400*b* are disposed to the wall surface WS. The control chips 200 are bonded to the surfaces of the respective covering portions COV with an insulating adhesive 600.

As described above, in the present embodiment, since the control chips 200 are bonded to the respective covering portions COV of the resin enclosure 300 with the adhesive 600, the covering portions COV of the resin enclosure 300 and the adhesive 600 are present between the control chips 200 and the lead terminal 400*a*. For example, a thickness of the adhesive 600 is determined by a diameter of a filler (not shown) contained in the adhesive 600. Therefore, if distribution of the filler diameter in the adhesive 600 is biased, the thickness of the adhesive 600 is partially reduced, which may incline the corresponding control chip 200 (see example ex1 in A1-A2 cross-sectional view).

For example, in a case in which the covering portions COV are not provided in the resin enclosure 300 (hereinafter, also referred to as first comparative example), in the portion at which the thickness of the adhesive 600 is reduced, the distance between the corresponding control chip 200 and the lead terminal 400*a* may be reduced, and insulation between the control chip 200 and the lead terminal 400*a* may not be reliably ensured. In a case in which insulation between the control chip 200 and the lead terminal 400*a* is not reliably ensured, a withstand voltage between the control chip 200 and the lead terminal 400*a* is reduced. In other words, in the first comparative example, the withstand voltage between the control chip 200 and the lead terminal 400*a* may not be reliably ensured. The withstand voltage is durability performance maintaining electrical insulation, for example, even in a case in which a high voltage is applied to an insulator. In a configuration in which the thickness of the adhesive 600 is prevented from being reduced to a predetermined thickness or less by limiting the filler in the adhesive 600 to a filler having a diameter of a predetermined value or more, cost of the adhesive 600 is increased.

In contrast, in the present embodiment, even in the portion at which the thickness of the adhesive 600 is reduced, the distance between the control chip 200 and the lead terminal 400*a* is secured by the corresponding coating portion COV positioned between the control chip 200 and the lead terminal 400*a*. Therefore, in the present embodiment, it is possible to reliably ensure insulation of each of the control chips 200 and the lead terminal 400*a* without increasing the cost of the adhesive 600. As a result, in the present embodiment, it is possible to reliably ensure the withstand voltage between each of the control chips 200 and the lead terminal 400*a*.

In the present embodiment, the side surface SD of the lead terminal 400*a* close to the space SP is covered with the inner wall portion WAL. For example, the covering portions COV are provided with intervals along the Y direction, whereas the inner wall portion WAL continues with a substantially constant width W30 over the entirety of the portion of the lead terminal 400*a* extending in the Y direction. For example, a surface of the inner wall portion WAL in the −X direction configures a portion of the wall surface WS defining the space SP (wall surface WS positioned in +X direction of wall surface WS along Y direction). In the present embodiment, since the inner wall portion WAL is provided, it is possible to prevent the lead terminal 400*a* from being caught by a mold when the resin enclosure 300 is demolded in the process of integrally forming the lead terminal 400*a* with the resin enclosure 300 by insert molding.

For example, in a case in which the inner wall portion WAL is not provided in the resin enclosure 300 (hereinafter, also referred to as the second comparative example), the side surface SD of the lead terminal 400*a* comes into contact with the mold in the process of integrally forming the lead terminal 400*a* with the resin enclosure 300 by insert molding. Therefore, in the second comparative example, in demolding, the lead terminal 400*a* may be caught by the mold, and the lead terminal 400*a* caught by the mold may be stripped off upwardly from the resin enclosure 300.

In contrast, in the present embodiment, since the side surface SD of the lead terminal 400*a* is covered with the inner wall portion WAL, it is possible to prevent the lead terminal 400*a* from being caught by the mold in demolding. As a result, in the present embodiment, it is possible to prevent the lead terminal 400*a* from being stripped off upwardly from the resin enclosure 300 in demolding.

In the present embodiment, since the side surface SD of the lead terminal 400*a* close to the space SP is covered with the inner wall portion WAL of the resin enclosure 300, it is possible to increase a creepage distance between the lead terminal 400*a* and the insulation metal substrate 140 as compared with the second comparative example. As a result, in the present embodiment, it is possible to improve the withstand voltage between the lead terminal 400*a* and the insulation metal substrate 140 as compared with the second comparative example.

In the present embodiment, as illustrated in the A1-A2 cross-sectional view, the enclosed portions ENV of the lead terminal 400*a* are enclosed by the portion of the resin enclosure 300 including the inner wall portion WAL and the covering portions COV in the cross-section orthogonal to the Y direction. The Y direction is a direction in which the lead terminal 400*a* extends in the enclosed portions ENV. In the present embodiment, even if the lead terminal 400a is pulled upward in demolding, it is possible to prevent the lead terminal 400a from being stripped off upward from the resin enclosure 300 because the enclosed portions ENV of the lead terminal 400a are enclosed by the resin enclosure 300.

In the present embodiment, as illustrated in the plan view of the area AR1 and the A1-A2 cross-sectional view, the maximum width (for example, width W10), in the X direction, of each of the portions of the lead terminal 400a covered with the respective covering portions COV of the resin enclosure 300 is narrower than the maximum width (for example, width W20) of each of the control chips 200 in the X direction. Therefore, for example, in the process of integrally forming the lead terminal 400a with the resin enclosure 300 by insert molding, a distance (width W10 of top surface TP1 in X direction) when the resin (material of resin enclosure 300) such as a PPS resin spreads to the top surface TP1 of the lead terminal 400a is reduced. As a result, in the present embodiment, in the process of integrally forming the lead terminal 400a with the resin enclosure 300 by insert molding, it is possible to efficiently spread the resin (material of resin enclosure 300) to the top surface TP1 of the lead terminal 400a.

Attention will be focused on spread of the resin, such as the PPS resin. A thickness Ti of each of the covering portions COV of the resin enclosure 300 is preferably greater than or equal to 30 μm, and a width W30 of the inner wall portion WAL of the resin enclosure 300 is preferably greater than or equal to 200 μm. In other words, the thickness Ti of each of the covering portions COV may be less than the width W30 of the inner wall portion WAL. To reliably ensure insulation between each of the control chips 200 and the lead terminal 400a, in the case in which the material of the resin enclosure 300 is the PPS resin, the thickness Ti of each of the covering portions COV of the resin enclosure 300 may be 20 μm.

As illustrated in the plan view of the area AR1 and the B1-B2 cross-sectional view, the top surface TP1 of the portion other than the enclosed portions ENV of the lead terminal 400a is exposed from the resin enclosure 300 without being covered with the covering portions COV. The wires 500a are connected to the portion other than the enclosed portions ENV of the lead terminal 400a. Next, a method of manufacturing the semiconductor apparatus 10 is described with reference to FIG. 3.

Figure 3:
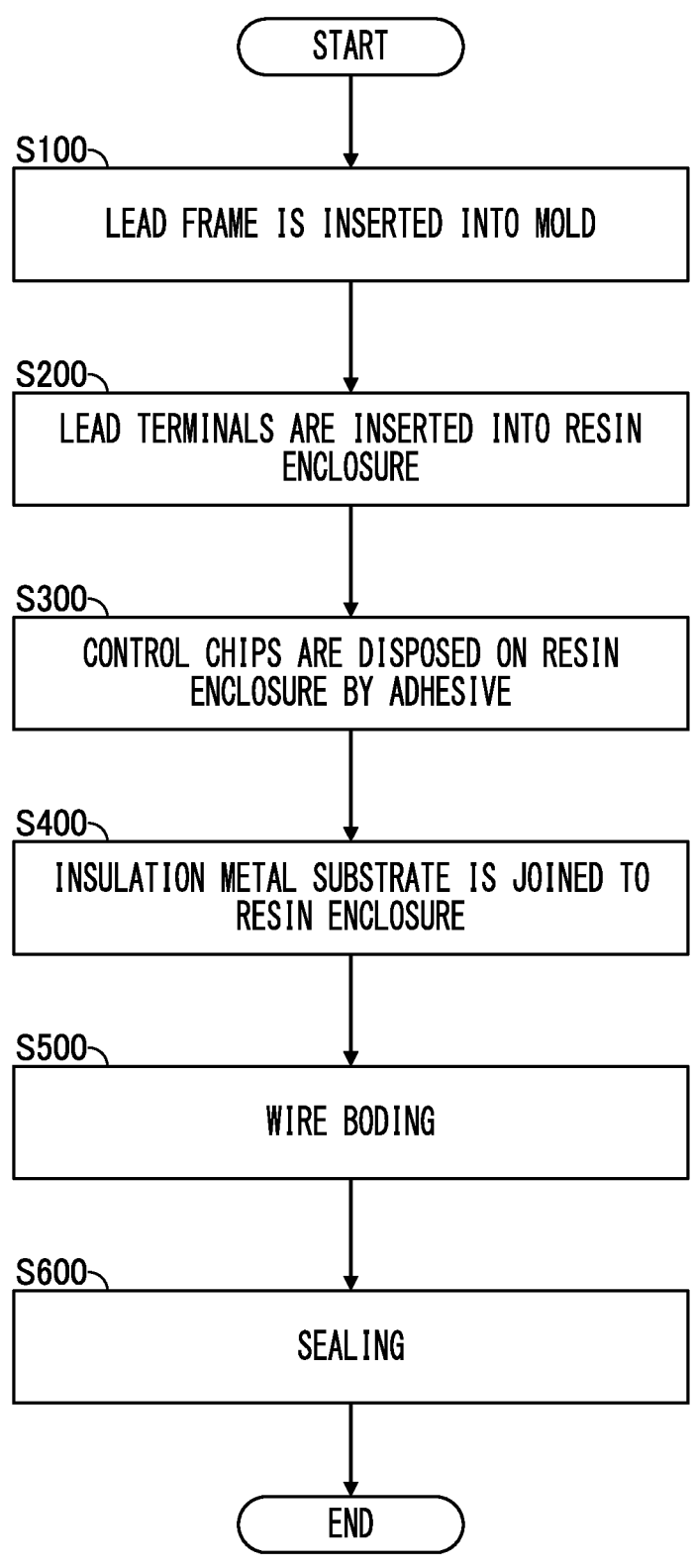
FIG. 3 is an explanatory diagram of a method of manufacturing the semiconductor apparatus illustrated in FIG. 1.

FIG. 3 is an explanatory diagram of the method of manufacturing the semiconductor apparatus 10 illustrated in FIG. 1.

First, in a first step S100, the lead frame including the lead terminals 400 is inserted into the mold for the resin enclosure 300.

Next, in a second step S200, insert molding to form the lead terminals 400 with the resin enclosure 300 is performed. For example, in the second step S200, the resin such as the PPS resin is injected into the mold into which the lead frame has been inserted, and the lead frame is divided into the lead terminals 400 after the resin is cured. As a result, the resin enclosure 300 into which the lead terminals 400 have been inserted is formed. As described above, the resin enclosure 300 into which the lead terminals 400 have been inserted is formed by curing the resin injected into the mold. For example, the resin enclosure 300 is formed so as to include the inner wall portion WAL from the wall surface WS defining the space SP to the side surface SD of the lead terminal 400a close to the space SP and the covering portions COV each covering at least a part of the top surface TP1 of the corresponding enclosed portions ENV of the lead terminal 400a. In the present embodiment, the covering portions COV cover the top surface TP1 of the lead terminal 400a facing the control chips 200. The lead terminal 400a is formed such that the enclosed portions ENV of the lead terminal 400a are enclosed by the portion including the inner wall portion WAL and the covering portions COV of the resin enclosure 300 in the cross-section orthogonal to the Y direction.

Next, in a third step S300, the insulating adhesive 600 is applied to portions of the resin enclosure 300 at which the control chips 200 are to be disposed, and the control chips 200 are disposed on the respective portions where the adhesive 600 is applied.

Next, in a fourth step S400, the insulation metal substrate 140 is joined so as to close the opening on the lower side of the resin enclosure 300. Before the fourth step S400 is performed, the circuit layers 120 may be disposed on the insulation metal substrate 140, and the chip pairs 100 (power semiconductor chips 102a and 102b) may be joined to the respective circuit layers 120. In bonding by the adhesive 600 and in joining of the substrate joining portion, a heat-curing treatment step may be appropriately performed.

Next, in a fifth step S500, wire boding to connect the wires 500 to terminals of the power semiconductor chips 102a, terminals of the power semiconductor chips 102b, terminals of the control chips 200, the lead terminals 400, and the like is performed. For example, in the wire bonding, a load and ultrasonic waves are applied to each of portions of the wires 500 connected to the lead terminals 400 and the like. In the present embodiment, since the enclosed portions ENV of the lead terminal 400a are enclosed by the resin enclosure 300, it is possible to suppress vibration of the lead terminal 400a in the wire bonding. In a case in which vibration of the lead terminal 400a is large, the ultrasonic waves applied to the wires 500 are dispersed, and the connections between the lead terminal 400a and the wires 500 are highly likely to become unstable, as compared with a case in which vibration of the lead terminal 400a is small. In the present embodiment, since vibration of the lead terminal 400a in the wire bonding is suppressed, it is possible to prevent the connection between the lead terminal 400a and the wires 500 from becoming unstable.

Next, in a sixth step S600, sealing treatment to seal the circuit layers 120, the chip pairs 100 (power semiconductor chips 102a and 102b), the control chips 200, the wires 500, and the like, with the sealing resin 700 is performed. For example, in the sealing treatment, a liquid resin (material of sealing resin 700) is injected into the space inside the resin enclosure 300 from the opening on the upper side of the resin enclosure 300, and heat-curing treatment to heat and cure the resin injected into the resin enclosure 300 is performed. As a result, the semiconductor apparatus 10 illustrated in FIG. 1 is obtained.

As described above, in the present embodiment, the semiconductor apparatus 10 includes the power semiconductor chips 102a, the control chips 200 controlling the power semiconductor chips 102a, the resin enclosure 300 having the space SP in which the power semiconductor chips 102 are positioned, and the lead terminal 400a. The lead terminal 400a is disposed in the resin enclosure 300, and is electrically connected to the power semiconductor chips 102a. The resin enclosure 300 includes the inner wall portion WAL from the wall surface SW defining the space SP to the side surface SD of the lead terminal 400a close to the space SP, and the covering portions COV covering the top surface TP1 of the lead terminal 400a facing the control chips 200. The enclosed portions ENV of the lead terminal 400a are enclosed by the portion including the inner wall portion WAL and the covering portions COV of the resin enclosure 300, in the cross-section orthogonal to the Y direction in which the lead terminal 400a extends in each of the enclosed portions ENV.

As described above, in the present embodiment, the resin enclosure 300 includes the covering portions COV covering the top surface TP1 of the lead terminal 400a. Therefore, in the present embodiment, insulation between each of the control chips 200 and the lead terminal 400a is secured by the covering portion COV positioned between each of the control chips 200 and the lead terminal 400a, which makes it possible to secure the withstand voltage between each of the control chips 200 and the lead terminal 400a. As a result, in the present embodiment, it is possible to improve reliability of the semiconductor apparatus 10 in which the semiconductor chips, such as the control chips 200, are disposed on the lead terminals. Accordingly, it is possible to reduce the rate of defective units in manufacturing processes.

In the present embodiment, since the side surface SD of the lead terminal 400a is enclosed by the inner wall portion WAL, it is possible to prevent the lead terminal 400a from being caught by the mold in demolding in the insert molding to integrally form the lead terminal 400a with the resin enclosure 300. As a result, in the present embodiment, it is possible to prevent the lead terminal 400a from being stripped off upwardly from the resin enclosure 300 in demolding.

In the present embodiment, the lead terminal 400a incudes the enclosed portions ENV enclosed by the resin enclosure 300 (portion including inner wall portion WAL and covering portions COV). Therefore, in the present embodiment, even if the lead terminal 400a is pulled upward in demolding, it is possible to prevent the lead terminal 400a from being stripped off upwardly from the resin enclosure 300 because the enclosed portions ENV of the lead terminal 400a are fixed to the resin enclosure 300. As described above, in the present embodiment, since the lead terminal 400a is prevented from being stripped off upward from the resin enclosure 300, it is possible to improve yield in manufacturing the semiconductor apparatus 10 in which the control chips 200 are disposed on the lead terminal 400a. Accordingly, it is possible to reduce the rate of defective units in manufacturing processes.

In the present embodiment, since the enclosed portions ENV of the lead terminal 400a are fixed to the resin enclosure 300, it is possible to suppress vibration of the lead terminal 400a in the wire bonding, and to prevent connection between the lead terminal 400a and the wires 500 from becoming unstable. As a result, in the present embodiment, in the case in which the control chips 200 are disposed on the lead terminal 400a, it is possible to improve reliability of the semiconductor apparatus 10 and yield in manufacturing the semiconductor apparatus 10. Accordingly, it is possible to improve the non-defective rate in the manufacturing process.

In the present embodiment, the enclosed portions ENV of the lead terminal 400a include the entirety of the portions of the lead terminal 400a overlapping with the respective control chips 200 in a planar view. In this case, the portion that may be caught by the mold in demolding is reduced, which makes it possible to prevent the lead terminal 400a from being stripped off upward from the resin enclosure 300.

In the present embodiment, the maximum width, in the X direction orthogonal to the Y direction, of each of the portions of the lead terminal 400a covered with the respective covering portions COV of the resin enclosure 300 is narrower than the maximum width of each of the control chips 200 in the X direction. In this case, in the insert molding to integrally form the lead terminal 400a with the resin enclosure 300, it is possible to efficiently spread the resin (material of resin enclosure 300) such as the PPS resin to the top surface TP1 of the lead terminal 400a.

A2: Second Embodiment

In the first embodiment, each of the enclosed portions ENV of the lead terminal 400a extends in the Y direction with substantially constant width W10. In contrast, in a second embodiment, as illustrated in FIG. 4, each of enclosed portions ENV1 of the lead terminal 400a includes a wide-width portion LP1 having a wide width W12 in the X direction, and narrow-width portions NP each having a width W11 narrower than the width W12 of the wide-width portion LP1.

Figure 4:
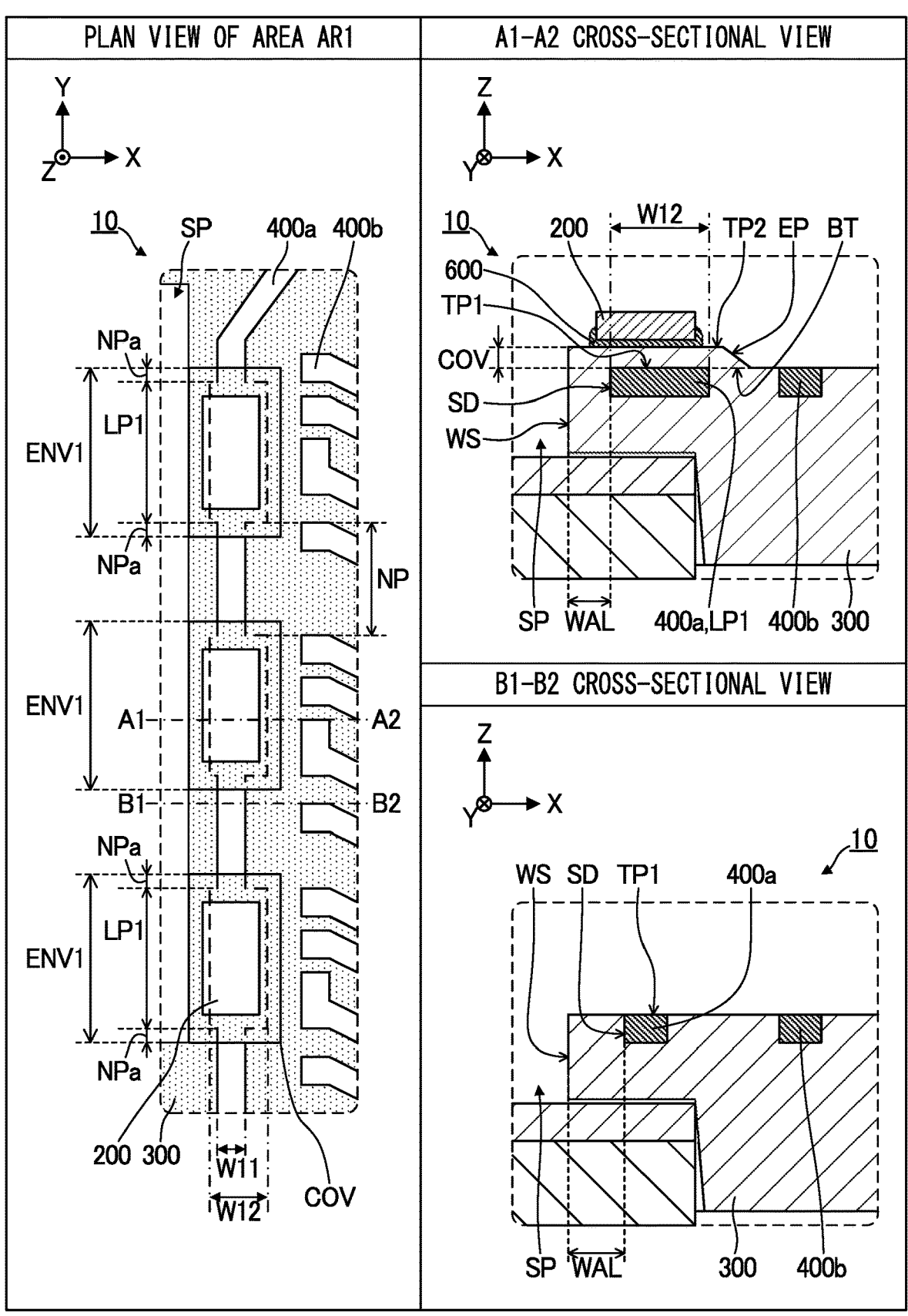
FIG. 4 is an explanatory diagram of an example of a semiconductor apparatus according to a second embodiment.

FIG. 4 is an explanatory diagram of an example of the semiconductor apparatus 10 according to the second embodiment. A plan view of FIG. 4 is an example of a plan view of an area AR1 (area corresponding to area AR1 surrounded by dashed line illustrated in the plan view in FIG. 1) of the semiconductor apparatus 10 according to the second embodiment, and corresponds to the plan view in FIG. 2. In addition, an A1-A2 cross-sectional view illustrates a cross-sectional surface of the semiconductor apparatus 10 taken along line A1-A2 in the plan view of the area AR1, and a B1-B2 cross-sectional view illustrates a cross-sectional surface of the semiconductor apparatus 10 taken along line B1-B2 in the plan view in area AR1. In FIG. 4, illustration of the wires 500 and the like is also omitted for clarity of illustration. Elements similar to the elements described with reference to FIG. 1 to FIG. 3 are denoted by similar reference numerals, and detailed description of the elements is omitted. In FIG. 4, the enclosed portions ENV are also referred to as enclosed portions ENV1.

The semiconductor apparatus 10 illustrated in FIG. 4 is similar to the semiconductor apparatus 10 illustrated in FIG. 1, except that a shape of each of the enclosed portions ENV1 of the lead terminal 400a is different from a shape of each of the enclosed portions ENV illustrated in FIG. 2. In the following, differences between the semiconductor apparatus 10 illustrated in FIG. 4 and the semiconductor apparatus 10 illustrated in FIG. 1 are mainly described.

In the present embodiment, as illustrated in the plan view of the area AR1, the lead terminal 400a includes the wide-width portions LP1 each having the wide width W12 in the X direction, and the narrow-width portions NP each having the width W11 narrower than the width W12 of each of the wide-width portions LP1. In the following, in each of the narrow-width portions NP of the lead terminal 400a, portions covered with the covering portions COV are also referred to as narrow-width portions NPa. In the present embodiment, each of the enclosed portions ENV1 of the lead terminal 400a includes the wide-width portion LP1 and the narrow-width portions NPa. In other words, in the lead terminal 400a according to the present embodiment, the wide-width portions LP1 are the enclosed portions ENV1, and a part of the narrow-width portions NP (narrow-width portions NPa) are also the enclosed portions ENV1. The wide-width portions LP1 of the enclosed portions ENV1 include the entirety of the portions of the lead terminal 400a overlapping with the respective control chips 200 in a planar view. The narrow-width portions NPa of the enclosed portions ENV1 are not overlapped with the control chips 200 in a planar view.

In other words, the control chips 200 are bonded, with the adhesive 600, to the respective portions covering the top surface TP1 in the wide-width portions LP1 of the covering portions COV, as illustrated in the A1-A2 cross-sectional view. Accordingly, the covering portions COV of the resin enclosure 300 and the adhesive 600 are present between the wide-width portions LP1 of the lead terminal 400a and the control chips 200. Since the wide-width portions LP1 are a part of the enclosed portions ENV1, the wide-width portions LP1 are enclosed by the portion including the inner wall portion WAL and the covering portions COV as with the enclosed portions ENV illustrated in FIG. 2. In the example illustrated in FIG. 4, to secure the width of the inner wall portion WAL (width in the X direction), the side surface SD of each of the wide-width portions LP1 is positioned in the +X direction (direction separating from space SP) more than the side surface of each of the control chips 200 close to the space SP. However, the side surface SD of each of the wide-width portions LP1 may be positioned in the −X direction more than the side surface of each of the control chips 200 closer to the space SP, as long as the width of the inner wall portion WAL is secured to be greater than or equal to a predetermined value. Alternatively, the side surface SD may be overlapped with the side surface of each of the control chips 200 close to the space SP in a planar view.

As illustrated in the A1-A2 cross-sectional view, out of the two side surfaces of each covering portion COV of the resin enclosure 300 along the Y direction, the side surface EP far from the space SP is inclined such that an area of a top surface TP2 of the covering portion COV is less than an area of a bottom surface BT. The top surface TP2 of each of the covering portions COV is a surface facing the corresponding control chip 200 in the covering portion COV, and the bottom surface BT of each of the covering portions COV is a surface on a side opposite to the top surface TP2 in the covering portion COV. Although not illustrated in the A1-A2 cross-sectional view, two side surfaces of each covering portion COV of the resin enclosure 300 in the X direction may also be inclined such that the area of the top surface TP2 of the covering portion COV is less than the area of the bottom surface BT. As described above, the side surface EP of each of the covering portions COV of the resin enclosure 300 may be inclined such that the area of the top surface TP2 of the covering portion COV facing the corresponding control chip 200 is less than the area of the bottom surface BT of the covering portion COV on the side opposite to the top surface TP2.

The cross-sectional surface of the semiconductor apparatus 10 illustrated in the B1-B2 cross-sectional view is similar to the cross-sectional surface of the semiconductor apparatus 10 illustrated in the B1-B2 cross-sectional view of FIG. 2. For example, the top surface TP1 of the portion other than the enclosed portions ENV1 of the lead terminal 400a is exposed from the resin enclosure 300 and is not covered with the covering portions COV in order to enable connection between the wires 500a and the lead terminals 400a.

As described above, in the present embodiment, the maximum width (for example, width W12 of each of wide-width portions LP1) in the X direction of each of the enclosed portions ENV1 of the lead terminal 400a is made greater than the maximum width (for example, width W10) in the X direction of each of the enclosed portions ENV of the lead terminal 400a illustrated in FIG. 2. In the present embodiment, it is also possible to achieve effects similar to the effects by the above-described first embodiment.

In the present embodiment, the side surface EP of each of the covering portions COV of the resin enclosure 300 is inclined such that the area of the top surface TP2 of the covering portion COV is less than the area of the bottom surface BT. Therefore, in the present embodiment, it is possible to easily inject the sealing resin 700 up to a boundary between each of the covering portions COV and the portion other than the covering portions COV. In the present embodiment, this makes it possible to prevent a void, at which no sealing resin 700 is present, from being generated near the boundary between each of the covering portions COV and the portion other than the covering portions COV. As a result, in the present embodiment, it is possible to improve the reliability of the semiconductor apparatus 10. In the first embodiment, each of the covering portions COV of the resin enclosure 300 may be formed such that the side surface EP is inclined, as with each of the covering portions COV illustrated in FIG. 4. Alternatively, in the present embodiment, each of the covering portions COV of the resin enclosure 300 may be formed such that the side surface EP is not inclined, as with each of the covering portions COV illustrated in FIG. 2.

A3: Third Embodiment

In the above-described embodiments, the entirety of the side surface SD of the lead terminal 400a close to the space SP is covered with the inner wall portion WAL. In contrast, in the third embodiment, as illustrated in FIG. 5, a part of the side surface SD of the lead terminal 400a close to the space SP is exposed to the space SP.

Figure 5:
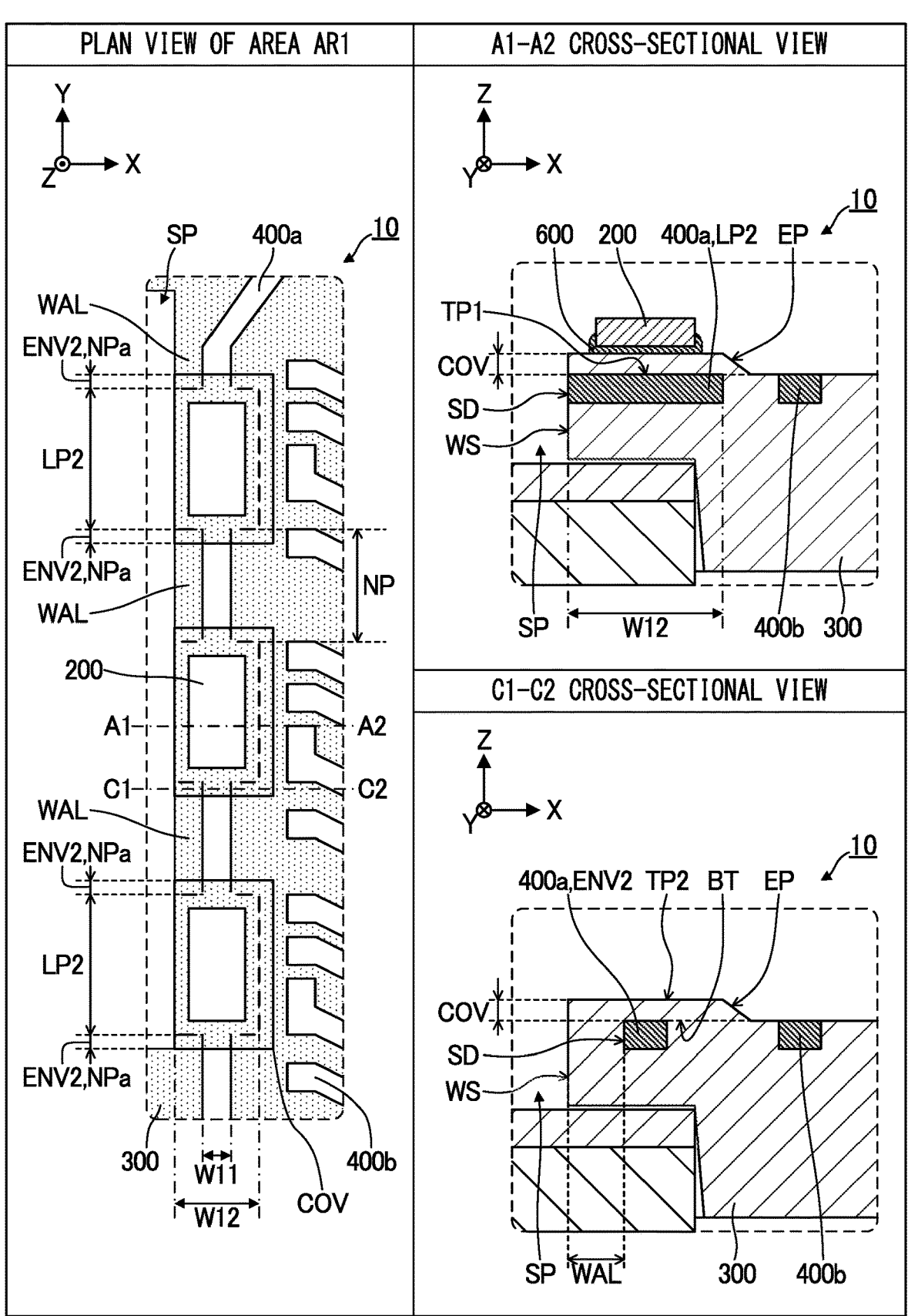
FIG. 5 is an explanatory diagram of an example of a semiconductor apparatus according to a third embodiment.

FIG. 5 is an explanatory diagram of an example of the semiconductor apparatus 10 according to the third embodiment. A plan view of FIG. 5 is an example of a plan view of an area AR1 (area corresponding to area AR1 surrounded by a dashed line illustrated in the plan view of FIG. 1) of the semiconductor apparatus 10 according to the third embodiment, and corresponds to the plan view of FIG. 2. An A1-A2 cross-sectional view illustrates a cross-sectional surface of the semiconductor apparatus 10 taken along line A1-A2 in the plan view of the area AR1. A C1-C2 cross-sectional view illustrates a cross-sectional surface of the semiconductor apparatus 10 taken along line C1-C2 in the plan view of the area AR1. In FIG. 5, illustration of the wires 500 and the like are also omitted for clarity of illustration. Elements similar to the elements described with reference to FIG. 1 to FIG. 4 are denoted by similar reference numerals, and detailed description of the elements is omitted. In FIG. 5, the enclosed portions ENV are also referred to as enclosed portions ENV2.

The semiconductor apparatus 10 illustrated in FIG. 5 is similar to the semiconductor apparatus 10 illustrated in FIG. 4 except that positional relationship between each of the enclosed portions ENV2 of the lead terminal 400a and the corresponding control chip 200 is different from the positional relationship between each of the enclosed portions ENV1 and the corresponding control chip 200 illustrated in FIG. 4. In the following, differences between the semiconductor apparatus 10 illustrated in FIG. 5 and the semiconductor apparatus 10 illustrated in FIG. 4 are mainly described.

In the present embodiment, as illustrated in the plan view of the area AR1, the portions of the lead terminal 400a covered with the respective covering portions COV of the resin enclosure 300 each include the enclosed portions ENV2, and a wide-width portion LP2. The wide-width portion LP2 has the width W12 in the X direction wider than the width W11 of each of the enclosed portions ENV2. In other words, in the lead terminal 400a according to the present embodiment, a part (narrow-width portion NPa) of the narrow-width portion NP having the width W11 narrower than the width W12 of the wide-width portion LP2 is the enclosed portion ENV2. Each of the wide-width portions LP2 of the lead terminal 400a includes the entirety of a portion of the lead terminal 400a overlapping with the corresponding control chip 200 in a planar view. In the example illustrated in FIG. 5, the inner wall portion WAL is formed so as to cover the side surface SD of the lead terminal 400a close to the space SP in a portion other than the wide-width portions LP2. In other words, in each of the wide-width portions LP2 of the lead terminal 400a, the side surface SD of the lead terminal 400a close to the space SP is not covered with the inner wall portion WAL. Therefore, the lead terminal 400a includes the enclosed portions ENV2 at positions not overlapping with the respective control chips 200 in a planar view.

The control chips 200 are bonded, with the adhesive 600, to the portions of the respective covering portions COV covering the top surface TP1 of the wide-width portions LP2, as illustrated in the A1-A2 cross-sectional view. Accordingly, the covering portions COV of the resin enclosure 300 and the adhesive 600 are present between the wide-width portions LP2 of the lead terminal 400a and the control chips 200. Furthermore, in the example illustrated in FIG. 5, the side surface SD close to the space SP, of each of the wide-width portions LP2 of the lead terminal 400a is exposed to the space SP without being covered with the inner wall portion WAL. In other words, in the example illustrated in FIG. 5, the wide-width portions LP2 of the lead terminal 400a are not included in the enclosed portions ENV2.

As illustrated in the C1-C2 cross-sectional view, the enclosed portions ENV2 of the lead terminal 400a are enclosed by the portion including the inner wall portion WAL and the covering portions COV. Therefore, in the present embodiment, it is also possible to prevent the lead terminal 400a from being stripped off upwardly from the resin enclosure 300 in demolding.

The portions of the covering portions COV covering the top surface TP1 of the enclosed portions ENV2 of the lead terminal 400a are formed integrally with the inner wall portion WAL. In other words, the covering portions COV cover both of the enclosed portions ENV2 and the wide-width portions LP2 of the lead terminal 400a and are formed integrally with the inner wall portion WAL. Therefore, it is possible to prevent the portions of the covering portions COV covering the top surface TP1 of the wide-width portions LP2 of the lead terminal 400a from being peeled from the wide-width portions LP2 of the lead terminal 400. In a case in which the covering portions COV bonded with the respective control chips 200 are peeled from the lead terminal 400a, the control chips 200 are not fixed and become unstable. Therefore, it is difficult to stably perform the wire bonding to connect the wires 500 to the control chips 200. In the present embodiment, the side surface SD of each of the wide-width portions LP2 of the lead terminal 400a is exposed to the space SP but the covering portions COV are prevented from being peeled from the lead terminal 400a. Therefore, it is possible to prevent the connection between the control chips 200 and the wires 500 from becoming unstable.

The side surface EP of each covering portion COV of the resin enclosure 300 is inclined such that the area of the top surface TP2 of the covering portion COV is less than the area of the bottom surface BT as with each of the covering portions COV illustrated in FIG. 4. In the present embodiment, each of the covering portions COV of the resin enclosure 300 may be formed such that the side surface EP is not inclined, as with each of the covering portions COV illustrated in FIG. 2.

The top surface TP1 of the portion of the lead terminal 400a excluding the wide-width portions LP2 and the enclosed portions ENV2 is exposed from the resin enclosure 300, and is not covered with the covering portions COV, in order to enable connection between the wires 500a and the lead terminal 400a.

As described above, in the present embodiment, the maximum width of each of the wide-width portions LP2 of the lead terminal 400a in the X direction is made greater than the maximum width of each of the wide-width portions LP1 of the lead terminal 400a in the X direction illustrated in FIG. 4. In the present embodiment, it is also possible to achieve effects similar to the effects in the above-described first and second embodiments.

A4: Fourth Embodiment

In the above-described embodiments, the top surface TP1 of the entirety of the portions of the lead terminal 400a overlapping with the control chips 200 in a planar view is covered with the covering portions COV. In contrast, in a fourth embodiment, as illustrated in FIG. 6, each of the covering portions COV1 of the resin enclosure 300 is formed such that a part of the top surface TP1 of the portion of the lead terminal 400a overlapping with the corresponding control chip 200 in a planar view is exposed from the resin enclosure 300.

Figure 6:
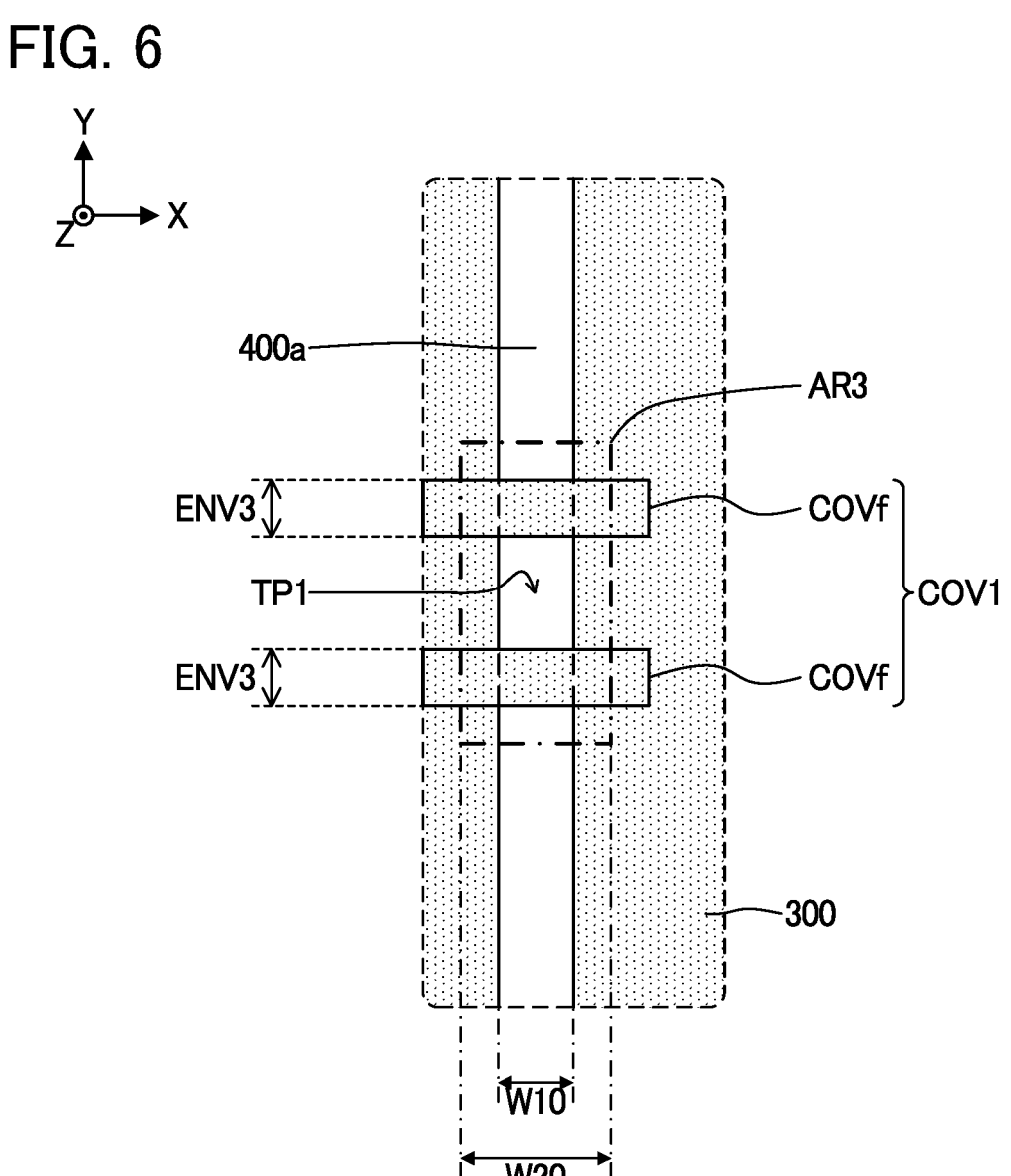
FIG. 6 is an explanatory diagram of an example of a semiconductor apparatus according to a fourth embodiment.

FIG. 6 is an explanatory diagram of an example of the semiconductor apparatus 10 according to the fourth embodiment. FIG. 6 is an example of a plan view illustrating a periphery of an area where one control chip 200 is disposed, in the semiconductor apparatus 10 according to the fourth embodiment. In FIG. 6, illustration of the control chip 200, the adhesive 600, the wires 500, and the like is omitted for clarity of illustration. A double-dashed dotted line rectangle in FIG. 6 illustrates a chip arrangement area AR3 at which one control chip 200 is disposed. Elements similar to the elements described with reference to FIG. 1 to FIG. 5 are denoted by similar reference numerals, and detailed description of the elements is omitted. In FIG. 6, the covering portion COV is also referred to as a covering portion COV1, and the enclosed portion ENV is also referred to as an enclosed portion ENV3.

The semiconductor apparatus 10 illustrated in FIG. 6 is similar to the semiconductor apparatus 10 illustrated in FIG. 2, except that the covering portion COV1 of the resin enclosure 300 is different from the covering portion COV illustrated in FIG. 2. In the following, differences between the semiconductor apparatus 10 illustrated in FIG. 6 and the semiconductor apparatus 10 illustrated in FIG. 2 are mainly described.

As illustrated in FIG. 6, the covering portion COV1 of the resin enclosure 300 includes first covering portions COVf each extending in the X direction. The first covering portions COVf are arranged with an interval in the Y direction on the top surface of the first portion of the lead terminal 400a so as to be overlapped with the corresponding control chip 200 in a planar view. As described above, the first covering portions COVf are provided as the covering portion COV1 in the resin enclosure 300 below (−Z direction) of one control chip 200. In other words, the lead terminal 400a includes enclosed portions ENV3 for each chip arrangement area AR3. In the present embodiment, the first portion may be a portion overlapped with any of the control chips 200 and may be an area including (surrounding) the enclosed portions ENV3.

In the example illustrated in FIG. 6, two first covering portions COVf are arranged below one control chip 200. However, three or more first covering portions COVf may be arranged below one control chip 200. Alternatively, one covering portion COV1 (for example, one covering portion COV1 filling gap between two first covering portions COVf illustrated in FIG. 6) having a length in the Y direction shorter than a length of the control chip 200 in the Y direction may be disposed below the control chip 200.

The enclosed portions ENV3 of the lead terminal 400a are enclosed by the portion including the inner wall portion WAL and the first covering portions COVf of the resin enclosure 300 in the cross-section orthogonal to the Y direction, as with the enclosed portions ENV illustrated in FIG. 2.

In the example illustrated in FIG. 6, the maximum width (for example, width W10) in the X direction of the portion of the lead terminal 400a covered with the first covering portions COVf of the resin enclosure 300 is narrower than the maximum width (for example, width W20) of the control chip 200 in the X direction. The lead terminal 400a may include the wide-width portions LP1 and the narrow-width portions NP as with, for example, the lead terminal 400a illustrated in FIG. 4. In other words, the maximum width in the X direction of the portion of the lead terminal 400a covered with the first covering portions COVf of the resin enclosure 300 may be equal to the maximum width of the control chip 200 in the X direction, or may be greater than the maximum width of the control chip 200 in the X direction.

In the present embodiment, each of the first covering portions COVf of the resin enclosure 300 may be formed such that the side surface EP is not inclined as with each of the covering portions COV illustrated in FIG. 2. Alternatively, each of the first covering portions COVf may be formed such that the side surface EP is inclined as with each of the covering portions COV illustrated in FIG. 4.

As described above, in the present embodiment, it is also possible to achieve effects similar to the effects by the first embodiment, the second embodiment, and the third embodiment described above. In the present embodiment, each of the covering portions COV1 of the resin enclosure 300 is formed such that a part of the top surface TP1 of the portion of the lead terminal 400a overlapping with the corresponding control chip 200 in a planar view is exposed from the resin enclosure 300. Therefore, in the present embodiment, for example, it is expected that the adhesive 600 applied to the chip arrangement area AR3 infiltrates into a gap between the lead terminal 400a and the resin enclosure 300 from the portion where the lead terminal 400a is exposed from the resin enclosure 300. In a case in which the adhesive 600 applied to the chip arrangement area AR3 infiltrates into the gap between the lead terminal 400a and the resin enclosure 300, adhesion between the lead terminal 400a and the resin enclosure 300 is improved. Therefore, in the present embodiment, it is possible to improve the adhesion between the lead terminal 400a and the resin enclosure 300. It is sufficient for the first covering portions COVf to cover at least a part of the top surface TP1 of the first portion of the lead terminal 400a. For example, a configuration as described below may be adopted. As described above, in FIG. 6, the first covering portions COVf are arranged with an interval in the Y direction on the top surface of the first portion of the lead terminal 400a so as to be overlapped with the corresponding control chip 200 in a planar view. Furthermore, the first covering portions COVf in FIG. 6 each have a rectangular shape long in the X direction in a planar view. Alternatively, for example, the first covering portions COVf may be each formed in a rectangular shape long in the Y direction in a planar view. For example, the first covering portions COVf may be arranged with an interval in the X direction on the top surface of the first portion of the lead terminal 400a so as to be overlapped with the corresponding control chip 200 in a planar view. In other words, the first covering portions COVf may be separately provided in the X direction.

B: Modifications

The above-described embodiments can be variously modified. Specific modifications that may be applied to the above-described embodiments are described below. Two or more modifications optionally selected from the following modifications may be combined as long as they do not conflict.

B1: First Modification

For example, in each of the above-described embodiments, a semiconductor chip including an integrated circuit (for example, LVIC) that differs from the integrated circuit (for example, HVIC) provided in each of the control chips 200, may be disposed on the lead terminal 400a.

Figure 7:
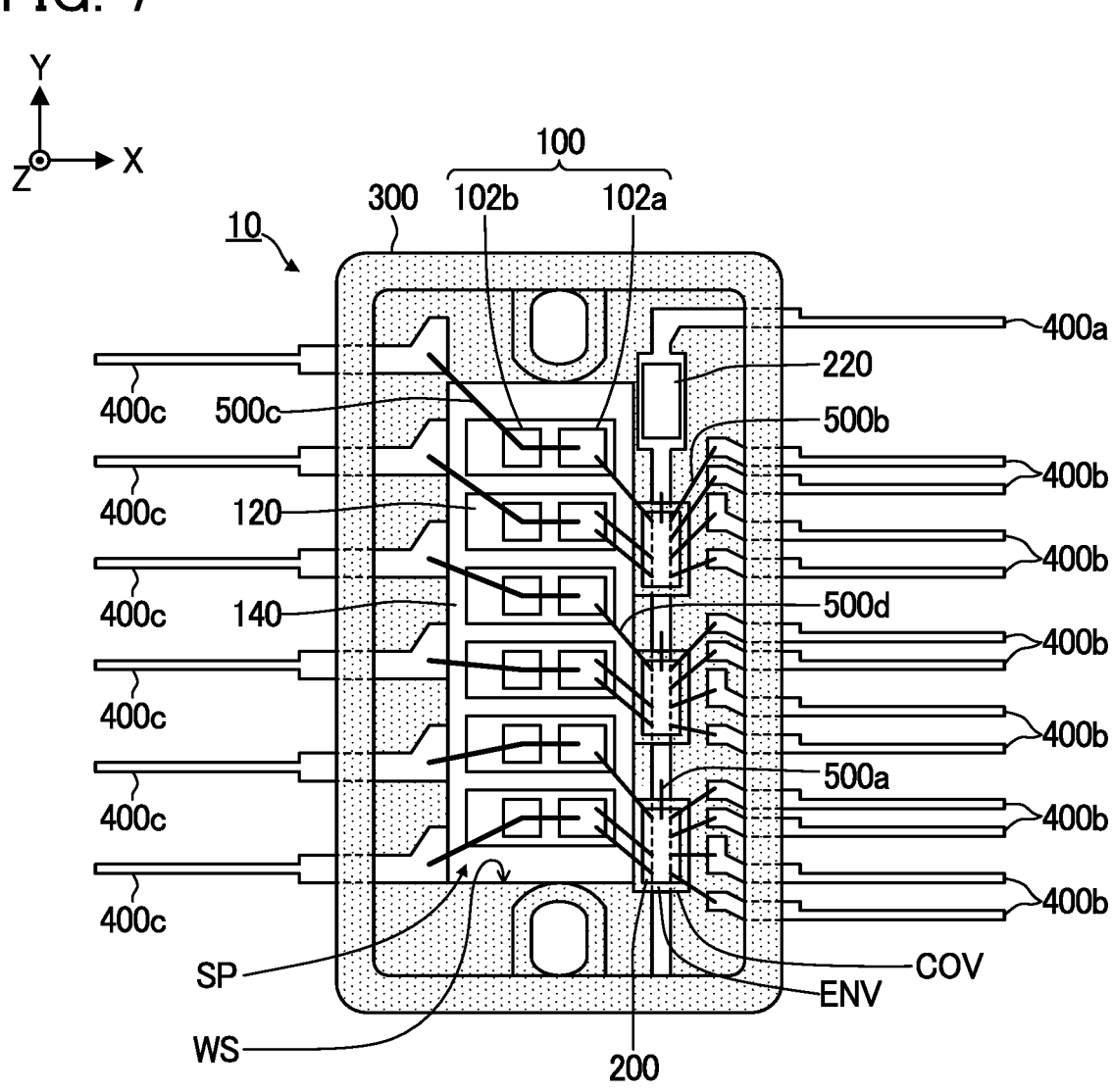
FIG. 7 is an explanatory diagram of an example of a semiconductor apparatus according to a first modification.

FIG. 7 is an explanatory diagram of an example of the semiconductor apparatus 10 according to a first modification. FIG. 7 is a plan view in a case in which the semiconductor apparatus 10 according to the first modification is viewed in a plane from the +Z direction. Elements similar to the elements described with reference to FIG. 1 to FIG. 6 are denoted by similar reference numerals, and detailed description of the elements is omitted.

The semiconductor apparatus 10 illustrated in FIG. 7 is similar to the semiconductor apparatus 10 illustrated in FIG. 1 except that a control chip 220 is disposed on the lead terminal 400a. In FIG. 7, illustration of the power semiconductor chips 102, the wires 500, the lead terminals 400, and the like connected to the control chip 220 are omitted for clarity of illustration. In the following, differences between the semiconductor apparatus 10 illustrated in FIG. 7 and the semiconductor apparatus 10 illustrated in FIG. 1 are mainly described.

In the present modification, a case will be assumed in which the integrated circuit provided in each of the control chips 200 is the HVIC, and an integrated circuit provided in the control chip 220 is the LVIC. In the example illustrated in FIG. 7, the control chip 220 is bonded to the lead terminal 400a by a conductive connection portion without passing through the covering portion COV of the resin enclosure 300. In other words, the covering portion COV of the resin enclosure 300 is not provided below the control chip 220.

The control chip 220 may be bonded to the covering portion COV covering the top surface TP1 of the lead terminal 400a with the adhesive 600 and may be connected to the lead terminal 400a by the wire 500a, as with each of the control chips 200. In this case, the control chip 220 is another example of a "second semiconductor chip".

As described above, in the present modification, it is also possible to achieve effects similar to the effects by the above-described embodiments.

B2: Second Modification

In each of the above-described embodiments, a portion between two of the enclosed portions ENV of the lead terminal 400a illustrated in FIG. 2 may be a wide-width portion having a width in the X direction wider than the width (for example, width W10) of each of the enclosed portions ENV. In this case, in the lead terminal 400a, the entirety of a narrow-width portion having a width narrower than the wide-width portion corresponds to the enclosed portion ENV. Alternatively, out of the wide-width portions LP1 and the narrow-width portions NP illustrated in FIG. 4, only a part of the wide-width portions LP1 may be covered with the covering portions COV. In this case, a part (portions covered with covering portions COV) of the wide-width portions LP1 of the lead terminal 400a corresponds to the enclosed portion ENV. As described above, in the present modification, it is possible to achieve effects similar to the effects by the above-described embodiments.

C: Application Example

Figure 8:
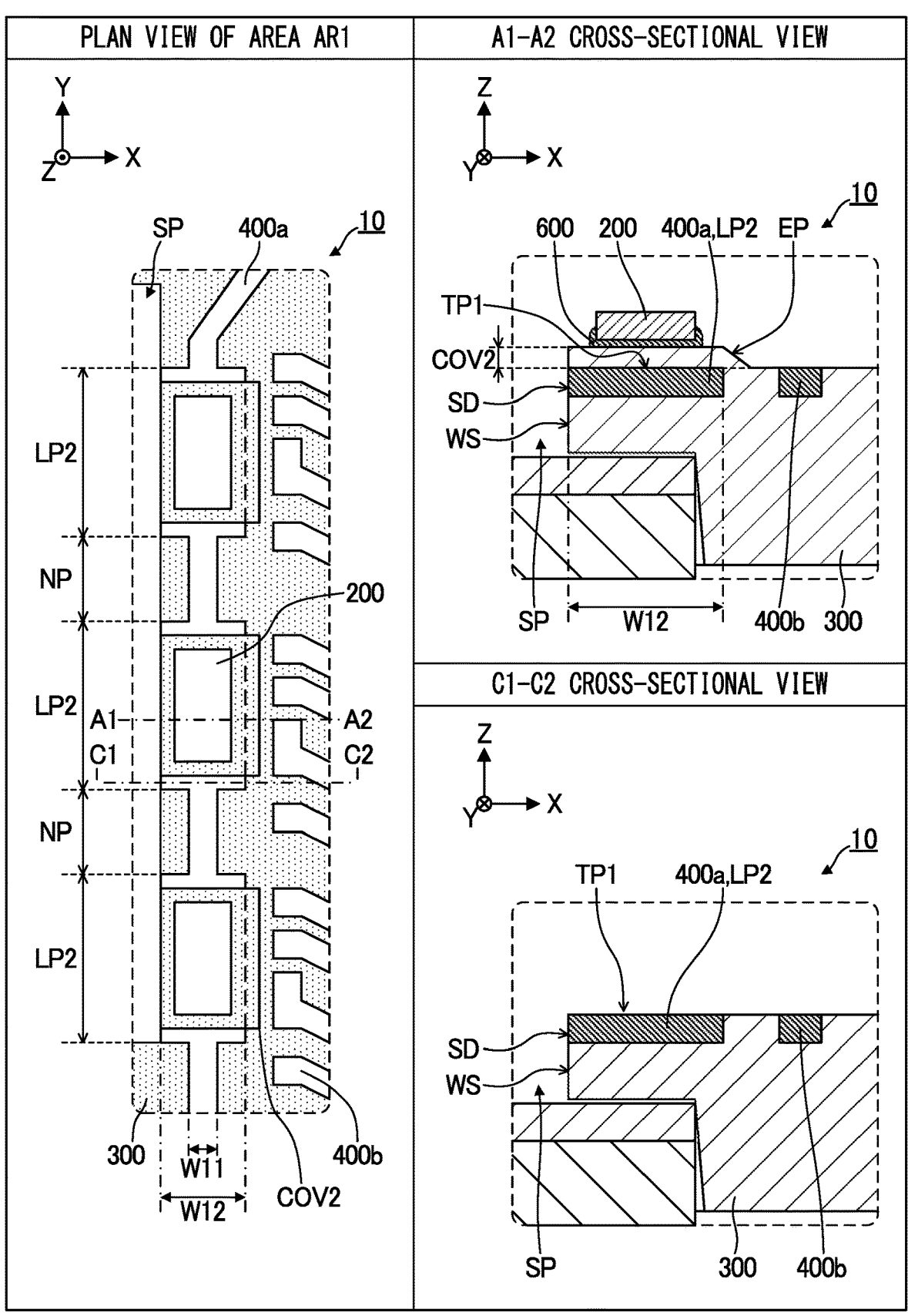
FIG. 8 is an explanatory diagram of an example of a semiconductor apparatus according to an application example.

FIG. 8 is an explanatory diagram of an example of the semiconductor apparatus 10 according to an application example. A plan view of FIG. 8 is an example of a plan view of an area AR1 (area corresponding to the area AR1 surrounded by dashed line illustrated in the plan view of FIG. 1) of the semiconductor apparatus 10 according to the application example, and corresponds to the plan view of FIG. 2. An A1-A2 cross-sectional view illustrates a cross-sectional surface of the semiconductor apparatus 10 taken along line A1-A2 in the plan view of the area AR1. A C1-C2 cross-sectional view illustrates a cross-sectional surface of the semiconductor apparatus 10 taken along line C1-C2 in the plan view of the area AR1. In FIG. 8, illustration of the wires 500 and the like is also omitted for clarity of illustration. Elements similar to the elements described with reference to FIG. 1 to FIG. 7 are denoted by similar reference numerals, and detailed description of the elements is omitted. In FIG. 8, the covering portions COV are also referred to as covering portions COV2.

The semiconductor apparatus 10 illustrated in FIG. 8 is similar to the semiconductor apparatus 10 illustrated in FIG. 5, except that the covering portions COV2 of the resin enclosure 300 are different from the covering portions COV illustrated in FIG. 5. In the following, differences between the semiconductor apparatus 10 illustrated in FIG. 8 and the semiconductor apparatus 10 illustrated in FIG. 5 are mainly described.

In the application example, as illustrated in the plan view of the area AR1, the lead terminal 400a includes (i) wide-width portions LP2 each having a wide width W12 in the X direction, and (ii) narrow-width portions NP each having a width W11 narrower than the width W12 of each of the wide-width portions LP2. In the example illustrated in FIG. 8, the wide-width portions LP2 of the lead terminal 400a include the entirety of portions of the lead terminal 400a overlapping with the control chips 200 in a planar view. The narrow-width portions NP of the lead terminal 400a do not overlap with the control chips 200 in a planar view.

The control chips 200 are bonded, with the adhesive 600, to the respective covering portions COV2 covering the top surface TP1 of the wide-width portions LP2, as illustrated in the A1-A2 cross-sectional view. Accordingly, the covering portions COV2 of the resin enclosure 300 and the adhesive 600 are present between the wide-width portion LP2 of the lead terminal 400a and the control chips 200. The side surface SD close to the space SP, of each of the wide-width portions LP2 of the lead terminal 400a is exposed to the space SP without being covered by the inner wall portion WAL. Furthermore, in the example illustrated in FIG. 8, each of the covering portions COV2 of the resin enclosure 300 is formed such that the side surface EP is inclined in a manner similar to each of the covering portions COV illustrated in FIG. 4. However, each of the covering portions COV2 of the resin enclosure 300 may be formed such that the side surface EP is not inclined in a manner similar to each of the covering portions COV illustrated in FIG. 2.

As illustrated in the plan view of the area AR1 and the C1-C2 cross-sectional view, the top surface TP1 of an edge (edge connected to narrow-width portions NP) along the X direction in each of the wide-width portions LP2 of the lead terminal 400a is exposed from the resin enclosure 300 and is not covered with the covering portions COV2. A cross-section orthogonal to the Y direction in each of the narrow-width portions NP of the lead terminal 400a is similar to the cross-section illustrated in the B1-B2 cross-sectional view of FIG. 2. In other words, the side surface SD close to the space SP in each of the narrow-width portions NP of the lead terminal 400a is covered with the inner wall portion WAL. The top surface TP1 in each of the narrow-width portions NP is exposed from the resin enclosure 300 and is not covered with the covering portions COV2.

As described above, in the application example, the resin enclosure 300 includes the covering portions COV2 covering the top surface TP1 of the lead terminal 400a facing the control chips 200. The insulating adhesive 600 that bonds the control chips 200 to the resin enclosure 300 is positioned at least between each of the covering portions COV2 of the resin enclosure 300 and the corresponding control chip 200. Each of the covering portions COV2 of the resin enclosure 300 may include the first covering portions COVf for each control chip 200 as with the covering portion COV1 illustrated in FIG. 6.

The following aspects are understood from the above-described application example.

The semiconductor apparatus 10 includes the power semiconductor chips 102a, the control chips 200 controlling the power semiconductor chips 102a, and the resin enclosure 300 having the space SP in which the power semiconductor chips 102a are positioned. The semiconductor apparatus 10 further includes the lead terminal 400a that is disposed in the resin enclosure 300 and is electrically connected to the power semiconductor chips 102a, and the insulating adhesive 600 that bonds the control chips 200 to the resin enclosure 300. The resin enclosure 300 includes the covering portions COV covering the top surface TP1 of the lead terminal 400a facing the control chips 200. The adhesive 600 is positioned between each of the covering portions COV of the resin enclosure 300 and the corresponding control chip 200.

In the application example, insulation between the control chips 200 and the lead terminal 400a is secured by the covering portions COV2 positioned between the control chips 200 and the lead terminal 400a, as in the above-described embodiments and modifications. Accordingly, in the application example, it is also possible to secure the withstand voltage between each of the control chips 200 and the lead terminal 400a, and to improve the reliability of the semiconductor apparatus 10.

In the application example, however, the covering portions COV2 of the resin enclosure 300 are not formed integrally with the inner wall portion WAL.

In the application example, the covering portions COV2 of the resin enclosure 300 may be formed such that a part of the top surface TP1 of the portions of the lead terminal 400a overlapping with the control chips 200 in a planar view is exposed from the resin enclosure 300. For example, each of the covering portions COV2 of the resin enclosure 300 may include the first covering portions COVf below the corresponding control chip 200 as with the covering portion COV1 illustrated in FIG. 6. In this case, it is expected that the adhesive 600 applied to the chip arrangement area AR3 will infiltrate into a gap between the lead terminal 400a and the resin enclosure 300 from the portion at which the lead terminal 400a is exposed from the resin enclosure 300.

Accordingly, in the application example, in the case in which the covering portions COV2 positioned below the respective control chips 200 are formed such that a part of the top surface TP1 of the lead terminal 400a is exposed from the resin enclosure 300, it is expected that the adhesion between the lead terminal 400a and the resin enclosure 300 will be improved. Furthermore, in a case in which the covering portions COV2 positioned below the respective control chips 200 are formed such that a part of the top surface TP1 of the lead terminal 400a is exposed from the resin enclosure 300, the covering portions COV2 are covered with the adhesive 600 applied to the chip arrangement area AR3. In this case, it is possible to prevent the covering portions COV2 from being peeled off from the lead terminal 400a.

DESCRIPTION OF REFERENCE SIGNS

10 . . . semiconductor apparatus, 100 . . . chip pair, 102 . . . power semiconductor chip, 120 . . . circuit layer, 130 . . . connection portion, 140 . . . insulation metal substrate, 142 . . . metal substrate, 144 . . . insulation layer, 200 . . . control chip, 300 . . . resin enclosure, 400 . . . lead terminal, 500 . . . wire, 600 . . . adhesive, 700 . . . sealing resin, COV, COV1, COV2 . . . covering portion, COVf . . . first covering portion, ENV, ENV1, ENV2, ENV3 . . . enclosed portion, FR1 . . . first frame portion, FR2 . . . second frame portion, FR3 . . . third frame portion, LP1, FP2 . . . wide-width portion, NP, NPa . . . narrow-width portion, SP . . . space inductor apparatus

What is claimed is:
1. A semiconductor apparatus comprising:
a resin enclosure forming a space;
a lead terminal in the resin enclosure and extending from an inside to an outside of the resin enclosure, the lead terminal including:
a top surface of the lead terminal, and
a side surface of the lead terminal;
a first semiconductor chip in the space;
a second semiconductor chip in the space, on the resin enclosure, and configured to control the first semiconductor chip; and
an adhesive between the second semiconductor chip and the resin enclosure,
wherein the resin enclosure includes:
a covering portion between the top surface of the lead terminal and the second semiconductor chip so as to cover the top surface of the lead terminal along at least a first portion of the lead terminal, and
an inner wall portion extending from an inner wall surface defining the space to the side surface of the lead terminal so as to cover the side surface of the lead terminal along at least a second portion of the lead terminal.
2. The semiconductor apparatus according to claim 1, wherein the inner wall portion and the covering portion form an enclosed portion of the lead terminal.

3. The semiconductor apparatus according to claim 2, wherein in a planar view, from a direction orthogonal to the top surface of the lead terminal, an entirety of an area of the lead terminal is overlapped by the second semiconductor chip.
4. The semiconductor apparatus according to claim 3, wherein in the planar view, from the direction orthogonal to the top surface of the lead terminal, a maximum width of a portion of the lead terminal covered by the covering portion is narrower than a maximum width of the second semiconductor chip.
5. The semiconductor apparatus according to claim 1, wherein the covering portion includes first covering portions,
the second semiconductor chip includes second semiconductor chips respectively corresponding to the first covering portions, and
in a planar view from a direction perpendicular to the top surface of the lead terminal, the first covering portions is spaced apart in intervals on the top surface of the lead terminal and each second semiconductor chip of the second semiconductor chips is on a respectively corresponding first covering portion of the first covering portions.
6. The semiconductor apparatus according to claim 1, wherein in a planar view from a direction perpendicular to the top surface of the lead terminal, the lead terminal includes:
a wide-width portion that has a first width in a first direction, and
a narrow-width portion having a second width that is narrower than the first width.
7. The semiconductor apparatus according to claim 6, wherein the first portion is at least a part of the wide-width portion of the lead terminal.
8. The semiconductor apparatus according to claim 6, wherein the first portion is at least a part of the narrow-width portion of the lead terminal.
9. The semiconductor apparatus according to claim 1, wherein a side surface of the covering portion is inclined.
10. The semiconductor apparatus according to claim 1, wherein the second semiconductor chip is inclined relative to the top surface of the lead terminal.
11. The semiconductor apparatus according to claim 1, wherein the adhesive includes a filler.
12. The semiconductor apparatus according to claim 11, wherein a distribution of a diameter of the filler is biased so as to cause the second semiconductor chip to be inclined relative to the top surface of the lead terminal.
13. The semiconductor apparatus according to claim 1, wherein the space is filled with a sealing resin.
14. The semiconductor apparatus according to claim 9, two or more side surfaces of the covering portion are inclined and an area of a top surface of the lead terminal of the covering portion is less than an area of a bottom surface of the covering portion.
15. A method of manufacturing a semiconductor apparatus including a resin enclosure forming a space, a lead terminal in the resin enclosure and extending from an inside to an outside of the resin enclosure, the lead terminal including: a top surface of the lead terminal, and a side surface of the lead terminal, a first semiconductor chip in the space, and a second semiconductor chip in the space, on the resin enclosure, and configured to control the first semiconductor chip, and an adhesive between the second semiconductor chip and the resin enclosure, the method comprising:

inserting a lead frame that includes the lead terminal into a mold for the resin enclosure; and forming, by injecting a resin into the mold and curing the resin, the resin enclosure that has a structure including:

a covering portion between the top surface of the lead terminal and the second semiconductor chip so as to cover the top surface of the lead terminal along at least a first portion of the lead terminal, and an inner wall portion extending from an inner wall surface defining the space to the side surface of the lead terminal so as to cover the side surface of the lead terminal along at least a second portion of the lead terminal;

applying the adhesive to the resin enclosure; and locating the second semiconductor chip on the adhesive.

* * * * *